United States Patent [19]
Wiznerowicz

[11] 3,991,364
[45] Nov. 9, 1976

[54] AUTOCORRELATION METHOD FOR DETECTING INSULATION DEFECTS IN CABLE

[75] Inventor: Fred Wiznerowicz, Hannover-Dohren, Germany

[73] Assignee: Kabel-und Metallwerke Gutehoffnungshutte Aktiengesellschaft, Hannover, Germany

[22] Filed: Jan. 29, 1975

[21] Appl. No.: 545,135

[30] Foreign Application Priority Data
Jan. 30, 1974 Germany............................ 2404223

[52] U.S. Cl. ................................. 324/52; 324/54
[51] Int. Cl.² .................. G01R 31/08; G01R 31/11
[58] Field of Search................ 324/52, 54, 77 H; 179/175.3 F

[56] References Cited
UNITED STATES PATENTS

| | | |
|---|---|---|
| 2,493,800 | 1/1950 | Biskeborn ............................ 324/52 |
| 2,628,267 | 2/1953 | Stringfield et al. .................. 324/52 |
| 2,688,124 | 8/1954 | Doty et al. ................ 324/77 H UX |
| 2,717,992 | 9/1955 | Weintraub ...................... 324/52 X |
| 2,800,627 | 7/1957 | Oudin et al. .......................... 324/52 |
| 2,885,590 | 5/1959 | Fuller......................... 324/77 H UX |
| 3,244,978 | 4/1966 | Craven et al. ................... 324/52 X |
| 3,462,681 | 8/1969 | Biskup .................................. 324/52 |
| 3,609,533 | 9/1971 | Pardis .................................. 324/52 |
| 3,727,128 | 4/1973 | McFerrin ............................. 324/52 |
| 3,753,086 | 8/1973 | Shoemaker ........................ 324/52 |

Primary Examiner—Gerard R. Strecker
Attorney, Agent, or Firm—Ralf H. Siegemund

[57] ABSTRACT

Defects in a cable are located by causing the defect to issue voltage pulses propagating in opposite directions; one pulse is reflected at one end and arrives at the other cable end later than the other pulse. The delay is indicative of the location of the defect and is ascertained by forming the auto-correlation function of a.c. signals which appear at that other cable end. For a phase setting of the auto-correlation function equal to that delay, the function has a pronounced peak. Calibration on the basis of correlating a stimulus with its reflection provides a maximum delay serving as a reference to locate defects by the auto-correlation method.

4 Claims, 4 Drawing Figures

AUTOCORRELATION METHOD FOR DETECTING INSULATION DEFECTS IN CABLE

BACKGROUND OF THE INVENTION

The present invention relates to measuring partial discharge and locating of defects in the insulation of conductors and cables. More particularly, the invention relates to detection and locating the occurance of discharges which propagate in the conductor as voltage and current pulses from the location of the defect and in both directions. The conductors and cables in which the problem arises are particularly communication cables, coiled conductors e.g. in machines and transformers or the like.

Investigations concerning the life expectancy of electrical cables resulted in the finding that the life is shortened by discharges due to local defects such as holes or cavities in the insulation. Such discharges will sooner or later destroy the surrounding insulation rendering the cable useless. Thus, a cable has to be tested as to defects which could produce partial discharges.

If an a.c. voltage is applied to a conductor having a defective insulation, electrostatic conditions lead to a partial discharge at that location if the voltage exceeds a particular amplitude which depends on the severity of the defect. As the discharge occurs, current and voltage pulses are produced and they propagate through the cable, particularly for example, along the outer shield. One pulse, for example, runs directly to the end of the cable to which a measuring device is connected. The other pulse, running in the opposite direction travels towards the other end of the conductor, and if that conductor is not terminated by its characteristic impedance, the pulse is reflected and will also arrive at the point of measurement.

The delay between the arrivals of these two pulses depends of course, upon the difference in travel paths. The delay has largest possible value when the location of the pulse producing defect is close to the particular cable end to which the measuring device is connected; the delay is zero if the defect is at the other, pulse-reflecting cable end. It was found, however, that pulses (discharges) of the same intensity may result in different indications as to the said delay. If one considers further that a cable, particularly a long cable, may have more than one defect, one obtains a mixture of superimposed, often oscillatory signals which renders the actual measurement of a defect or defects quite difficult.

The detection of defects by means of the partial discharge method is also difficult because the voltage pulse produced by a discharge in and through an insulation defect has a level that is comparable with the voltage that appears in the cable due to the fact that the cable may act like a radio antenna. Thus, the cable may pick up radio signals or other h.f. signals due to unshielded switching actions in the vicinity. These voltages act as noise with regard to the measurement and the partial discharge voltage may exceed the noise level very little if at all. Therefore, the cable cannot be tested in the field under total disregard to the ambient conditions. Rather, the cable to be tested must be carefully shielded and expensive filter etc. must be employed also. There is, therefore, a need for locating insulation defects in the field.

DESCRIPTION OF THE INVENTION

It is an object of the present invention to find a method for detecting local insulation defects in a cable under utilization of voltage pulses produced by discharge in the defective location and permitting extraction of the voltage pulse from noise.

In accordance with the preferred embodiment of the present invention, it is suggested to process the signal arriving at the one cable end (or point of measurement generally) together with noise by forming the autocorrelation function with a variable delay. Specifically, let $s(t)$ be the signal that is actually detected (as a function of time $t$) and which includes the desired measuring signal as well as noise. The auto-correlation function in the mathematical sense is given by $$\lim_{T \to \infty} \frac{1}{2T} \int_{-T}^{+T} S(t) \cdot S(t+t_1) \, df = \phi(t_1)$$

wherein $t_1$ is a predetermined delay, which should be adjustable. That function can in reality be approximated by choosing an integration period $2T$ which is large as compared with any chosen duration $t_1$ of a pulse.

Upon implementing the function, one will provide the signal train $s(t)$ directly, and additionally in a second channel but delayed by $t_1$. The resulting two signals are multiplied with each other. The product is likewise a time variable function and is integrated over a certain time span ($2T \gg t_1$). The signal representing the integral should be divided by the integration time span $2T$, but that value is only a constant in the arithmetic performed, and since absolute values are not of interest, that division can be ignored. The length of $2T$ can be selected so that in accordance with experience the product $S(t) \cdot S(t+t_1)$ when integrated over time spans for signal portions wherein $t > T$ or $t < -T$, results in zero. In reality, $T$ larger than twice $t_1$ suffices.

As a general rule, the auto-correlation function $\phi(t_1, T)$ of a composite signal $S(t)$ exhibits a maximum whenever signal excusions of the same polarity relation appear repeatedly at a spacing of $t_1$. The particular signal $S(t)$ considered here is always a composite signal which includes pairs of pulses with a constant time difference when produced by a defect which is stimulated repeatedly for partial discharge; one pulse of a pair reaches the measuring device directly, a second one only after reflection at the other cable end, but that delay is always the same. Specifically, the delay $\Delta t$ between these pulses is given by $\Delta t = 2(L - x)/V$ wherein $L$ is the length of the cable or conductor, $x$ is distance of the defect from the instrument ($L - x$ being accordingly the distance between defect and reflecting cable end), and $V$ is the propagation speed for pulses on the conductor.

Other defects as well as ambient disturbances will exhibit a completely arbitrary phase difference relative to the specific pulses in question. The other signal portions within $S(t)$ will have no correlation to the delayed signal $S(t+t_1)$ and vice versa. Hence, the pulses which originated from a defect are noise in relation to pulses originating from other defects and in relation to other voltages which appear for some reason in the cable so that these pulses will contribute little to the integral above when correlated with other noise. Also, when the signal delay $t_1$ is adusted to equal a delay $\Delta T$ between two pulses of the same origin (defect), pulses originating in other defects are not correlated to each other and their correlation with other noise contributes little to the integral.

Of course, by chance a pair of noise pulses may appear once in exactly the same time phase relation as a pair of measuring pulses, but that is not a recurring event. Thus, if the measurement is made repeatedly i.e. if partial discharges are caused repeatedly and if the auto-correlation function is formed but covering an integration period spanning many repetitions, a pronounced maximum in the correlation function will develop only as a result of consistent occurrances of such pulse pair, always having the same propagation and arrival delay among them. Therefore, if one adjust $t_1$ and observes an auto-correlation maximum an indication is provided therewith that the two pulses so delayed and consistently correlating with each other are in fact produced by discharge in an insulation defect.

As a consequence, particular values for $\Delta t$ can be detected by the auto-correlation method (and the corresponding value for x can be determined from the equation above) even if the ambient disturbance such as ambient electrical and/or magnetic fields or even galvanically coupled noise sources result in a S/N ratio smaller than unity.

This auto-correlation method has two specific advantages. One is that one will be able to detect even minor defects producing only very weak discharges and voltage pulses. Additionally, the method is readily applicable for testing cable that has already been laid, because no longer is it necessary to limit the employment of the defect locating operation to rooms that are adequately shielded.

It should be mentioned, that the equation for the auto-correlation function of signals has been used in communications in order to eliminate noise from measuring signals or intelligence. However, the present invention refers to a different aspect here. One has to consider that a partial discharge in an insulation defect as such produces voltage pulses which could readily be regarded also as noise. The inventive method as applied permits separation of that "noise" from other noise to gain valuable information, namely the location of a (or several) defect. Decisive is, that the voltage pulse resulting from a partial discharge in a defect and travelling at first away from that defect, is permitted to reflect at the cable end opposite the one to which the instrument is connected. Then and only then can the "noise" be converted into specific information because the pulses of specific delays occur on a repeated basis only, if the stimulation of the partial discharge at the defect is periodically repeated, and if the reflection is a pronounced one in each instance so as to obtain a distinctive auto-correlation maximum, which is quite discernible from other noise.

DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

Proceeding now to the detailed description of the drawings, FIG. 1 illustrates a cable 1 being insulated and provided on its outside with a shield 2. One end 3 of the cable 1 is connected to the test equipment. The other end 4 just ends and is not terminated at all by a matching resistor-capacitor arrangement or the like.

Figure 1:
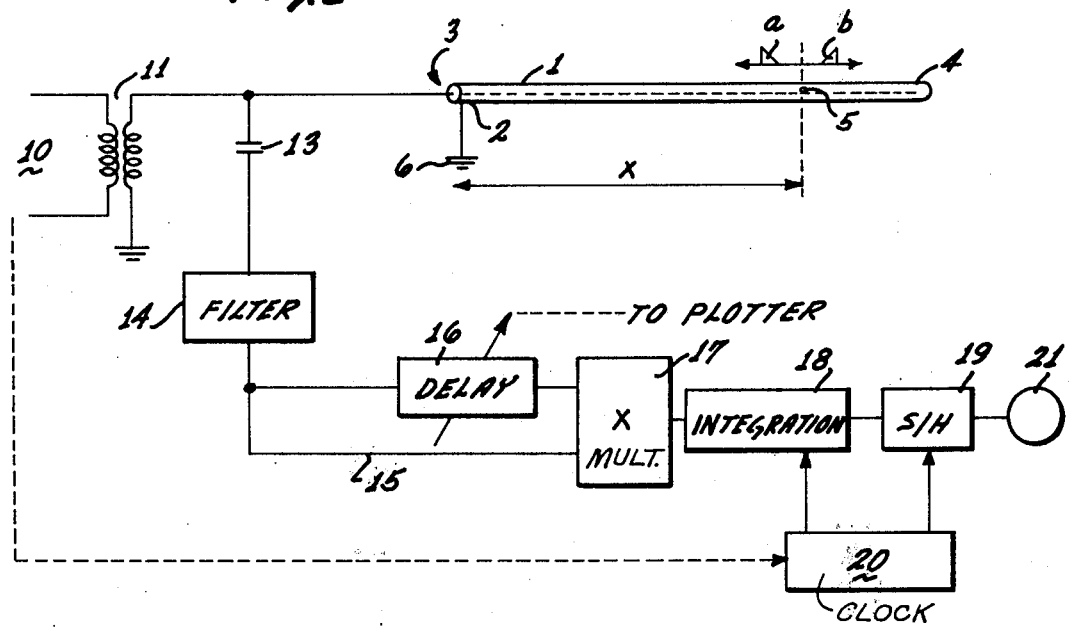
FIG. 1 is a schematic view and block diagram for explaining the practicing of the method in accordance with the preferred embodiment of the present invention.

Terminating the cable at end 4 by the characteristic impedance of that cable constitutes, so to speak, the most unfavorable condition for practicing the inventive method. Maximum impedance mismatch, i.e. most favorable conditions for reflection of a pulse (being rich in high frequencies) at that end is desirable. Fortunately, from a practical point of view, it was found that not terminating this cable end at all satisfies this desire for optimization.

The cable is presumed (for the moment) to have a single defect 5 such as a hole in the insulation, permitting local, partial discharge as between cable core and shield when a suitably high voltage is applied to the cable. The instrumentation to be described next generates such voltage as partial discharge stimulant and evaluates the results.

The instrumentation connected to cable end 3 includes a source 10 for a.c. signals (or pulses), applied to the cable via a transformer 11 to obtain a suitably high level. That level of course depends on the type of cable to be tested, and here particularly, on the type and thickness of the insulation. One side of the secondary winding of transformer 11 is connected to cable end 3, via a connecting line 12; the other side of the transformer secondary is grounded. The shield 2 of cable 1 is likewise grounded, so that the stimulating voltage on the cable conductor is true a.c. with reference to the shield.

Connecting line 12 is connected additionally to a coupling capacitor 13, to eliminate any d.c. component that may appear on the conductor. The signal as derived from the cable is passed through capacitor 13 to eliminate from the signal train the stimulating signal as fed into the cable by the source 10.

It should be noted here that the pulses produced by partial discharge through defect-hole 5 are rich in high frequencies. The stimulating signal frequency from source 10 is lower, e.g. 50 or 60 Hz and, therefore, can readily be eliminated by capacitor 13, which may be a component of an additional filter 14. On the other hand, if the expected propagation periods for pulses through the cable are very different (i.e. much shorter) than the oscillation period of the stimulating source, filtering may not be necessary, because the stimulating signal (even though of much higher amplitude than the measuring signal) may not interfere with the signal processing as will be explained shortly. However, care must be taken not to correlate any arriving pulse with the stimulus.

The preprocessed signal is fed into two channels 15 and 16, whereby channel 15 is a direct connection furnishing signals S(t) while channel 16 includes an adjustable delay for delaying the signal S(t) by the adjustable period t, so that this channel 16 provides signal $S(t + t_1)$.

The two channels 15 and 16 connect to a multiplication network 17 which may be of the analog or of the digital variety. In the latter case, signals S(t) and $S(t + t_1)$ are sampled, concurrently at a high rate (large as compared with expected inverse values for $t_1$; digitized and multiplied. Circuit 17, therefore, furnishes the product $S(t) \cdot S(t + t_1)$ as a function of time (and of $t_1$).

The resulting product signal is integrated in a circuit 18. If the measuring circuit operates digitally, the integrator 18 may simply be an adder, adding each product signal to the sum of the previously added signals. It should be noted, that the product signal can be positive as well as negative, because stimulation as well as output coupling is strictly a.c. The integrated value is sampled at the end of a predetermined period T in a sample and hold circuit 19. The sampling signal resets the integration (adder) 18. The sampling signal may issue from a relatively slow clock 20 to obtain periodic updating and new readings at a cycle rate of 1/T. Actually, circuit 20 may be a recycling counter, counting pulses as derived from source 10 via a wave shaper.

The integration period can be large as compared with the rate of recurring stimulation. The sampled value is indicated by an instrument 21 e.g. an oscilloscope or the like. This sampled and indicated output is the auto-correlation function as per the equation given above, except that a division by 2T is not performed. Such a division is not needed as only different integration outputs for differently adjusted values $t_1$ will be compared with each other whereby consistently the same integration period is being used.

Upon adjustment of the delay circuit in channel 16 one will obtain variations in the output of the integrator 18 if in fact the signal S(t) is not purely noise. The readout can be carried out visually in that the operator manipulates the adjustment in the delay channel 16, possibly back and forth when detecting a signal maximum. Alternatively, a plotter may be used plotting the sample and hold output versus time, time here being $t_1$ in that the advance of the plotter is coupled to the adjustment of the delay. The "flow" of time $t_1$ should be slow as compared with the integration period, so that this time $t_1$ appears to be near constant even for sequential integrations.

Figure 2:
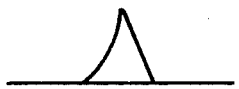
FIGS. 2 and 3 show pulse wave forms as they appear and are encountered in the circuit of FIG. 1.
Figure 3:

In operation, therefore, the test voltage from source 10 is applied to the cable via conductor 12. In view of the fact that cable end 4 is just left unconnected, no closed d.c. circuit exists except through a discharge path at a hole such as 5. The cable is, therefore, periodically charged but any defect 5 produces a partial discharge at each stimulating voltage peak, so that voltage pulses a and b (see also FIG. 2) appear and propagate from the location of the defect in opposite directions. The pulse a travels directly to cable end 3 while pulse b travels to end 4, is reflected thereat and travels subsequently also towards cable end 3.

As stated, x is the (unknown) distance of defect 5 from cable end 3 so that the pulses a and b arrive at point 3 with a delay Δt which is given by $2(L - x)/V$. The measuring circuit now generates the auto-correlation function of the signal or pulse sequence S(t). While channel 16 produces a delayed pulse sequence $S(t + t_1)$. The signal is a true pulse sequence, because the stimulation recurs at the rate of the source 10, once for each half wave.

The integral formed in circuit 18 and detected in circuit 19 will produce a maximum when $t_1 = \Delta t$. For $t_1 << \Delta t$ or $t_1 >> \Delta t$ and suitably larger T integrator 18 will provide a near zero signal, but for $t_1 \approx \Delta t$ the integrator will produce a pronounced signal ampliude. By operation of the relation above, $t_1 = 2(L - x)/V$, one can determine the location x of the defect.

The delay $t_1 = \Delta t$ can readily be presumed to be small as compared with the oscillating period of stimulating source 10. Moreover, the adjustment range for circuit 16 can readily be chosen to exclude the period of source 10. The ranges can be readily apart so that the periods corresponding to major harmonics of that stimulating signal are likewise excluded from the $t_1$ adjustment range of 16. This way, the auto-correlation function with a delay corresponding to the stimulation will not be produced.

It has to be observed that pulses a and b will not have the same wave shape when arriving at end 3. Little distortion for pulse a can be expected particularly when the defect is rather close to cable end 3 (FIG. 1), but pulse b has maximum travel time in this instance and will be flattened (e.g. FIG. 2). This distortion will be quite pronounced when the propagation characteristics of the cable is dependent upon frequency to a noticeable extent (attenuation and phase shift). However, the pulse time area remains constant because the transported charge remains about the same (assuming that the insulation has in fact very high resistance). Since the measuring technique used actually defect charges, the product $S(t) \cdot S(t + t_1)$ must be formed correctly to determine and to respond to a discharge at and by the defect 5. Thus, channel 16 could include additional filter means to shape the signal $S(t + t_1)$ so as to obtain a more comparable contour with signal a. However, even pulse b when arriving at 3 has still a pronounced excursion permitting ready correlation with pulse a.

Prior to running the instruments in the measuring mode as described it is advisable to obtain calibration. For this, a pulse, i.e. a signal with sharp signal flanks is fed into the cable at end 3. Sufficient portions of the signal will pass filter 14 if used so that the inputted signal qualifies as a signal S(t) with a known location x = 0 as production. The pulse will travel for the length of the cable, reflected at end 4 and return. The atuo-correlation function i.e. the integrator output will clearly have a maximum for $t_1 = 2L/V$. Since L is a known or readily obtainable quantity, one can ascertan V from this calibration measurement to have validity for this particular cable.

The second calibration measurement is carried out by transmitting pulses into and through the cable from end 4. This particular procedure simulates $x = L$ for which $t_1 = \Delta t \times 0$. This then can serve as zero point for the measurement, particularly for the amplitude level for that particular situation, giving an indication of the expected excursion. Also, the adjustment for channel 16 does need a zero point adjustment and fine trimming to match the delays in channels 15, 16 to the zero delay situation as far as the signals is concerned.

Figure 4:
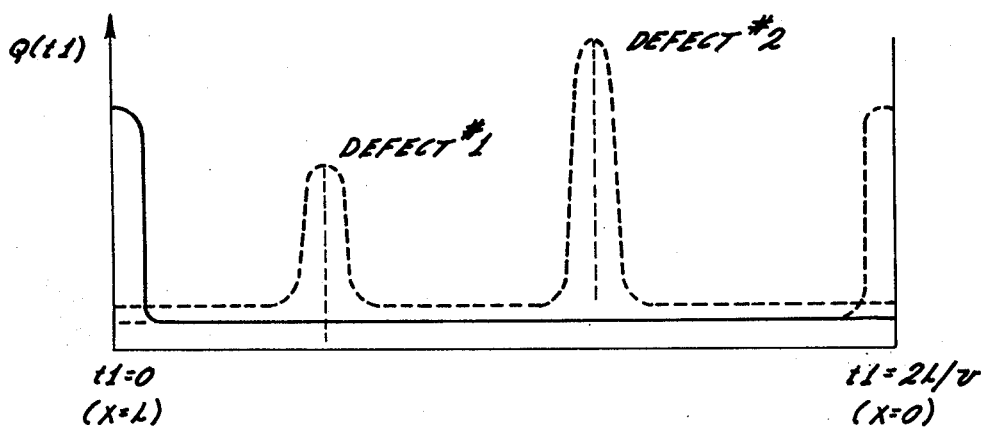
FIG. 4 shows the correlation function as defined and as generated electrically in the circuit of FIG. 1, whereby particularly calibration procedure and actual measurement and defect detection will be explained with reference to that Figure.

FIG. 4 illustrates the situation as observable for these two calibration tests. The lefthand signal peak (integrator output) results from calibration pulses sent into cable end 4 at delay adjustment in channel 16 $t_1 = 0$. The righthand most pulse detects in effect the maximum possible $t_1$. Specifically, the channel setting for an auto-correlation peak as produced on the basis of correlating direct stimulus with reflection thereof yields a value $t_{max} = t_{1\ max} = 2L/V$. Since L is known, V can be determined emperically by this calibration so that later values for x (defect location) can be derived from the measurements to follow.

The two other signal peaks in FIG. 4 represent in effect two defects ascertained by running $t_1$ from 0 to $t_{1\ max}$. Whenever the channel delay $t_1$ has been adjusted to equal the delay between two pulses produced by partial discharge in a defect, the pulse b in signal $S(t)$ will coincide with pulse a in signal $S(t + t_1)$ so that the multiplication will result in a signal not cancelled during the integration period. Rather, repeated occurance of that result due to recurring stimulation will occur on a cumulative basis as far as the integration is concerned, so that a pronounced signal peak will be produced by the integrator. That value will be sampled and held and produced again as long as the adjustment of $t_1$ in channel 16 is not changed. For other adjustments of the channel delay, each of these pulses is just noise and will contribute little to the integration. This is particularly true also for the pulses $a$, $b$ from the second defect. These pulses will not interfere with the auto-correlation function as far as producing the peak is concerned by means of which the first defect was detected.

It should be mentioned further that by scaling the setting from $t_1 = 0$ to $t_1 = t_{max}$ as representing cable length L, one can directly derive from the location of the signal peaks the location of the defects in cable length fractions of L without having to ascertain V.

The invention was explained with reference to the formation of an auto-correlation function. One can, however, use other principles of measurements based on statistics and probabilities and methods based on stochastic — ergodic principles. The basic underlying principle here is that on detecting a pulse which recurs periodically at stimulation rate, and upon detecting more often than not another pulse always the same period later, the probability is high that these two pulses originated from a common source, namely by discharge through an insulation defect. By correlating the signal $S(t)$ separately with each of two pulse trains serving as reference and having an adjusted delay between them, the correlation function will exhibit peaks if the delay corresponds to said delay $\Delta T$ for a pulse pair having a common source.

The measuring signal $S(t)$ can be multiplied with synthesized or quasi-random noise functions. The noise generated may be varied in amplitude as well as with respect to frequency spectrum and distribution. The pulses actually produced by local discharge have a known frequency distribution. By correlating the signal received with a synthesized signal particularly rich in components of the signals produced on local discharge, their occurrence can be detected in time, because the correlation function generated will produce peaks for these components. One can, therefore, use all known correlation functions and synthesize the needed reference or derive it from the signal itself, such as the first order auto-correlation function explained above.

The instruments employed may indicate the integration output directly, but linearization may be needed particularly if the integration period is variable. Scale contraction may be desirable through logarithmic processing. This way, the reading of auto-correlation peaks can be rendered more pronounced so as to obtain a higher degree of sensitivity in the range of peak detection of the correlation function as plotted or originally indicated.

The invention is not limited to the embodiments described above but all changes and modifications thereof not constituting departures from the spirit and scope of the invention are intended to be included.

I claim:

1. Method for detecting the location of an insulation defect in a cable prone to exhibit a partial discharge at that location and wherein the cable is of the type exhibiting propagation of voltage pulses along its extensions upon occurrence of such a discharge, comprising the steps of:

transmitting stimulating voltage pulses into the cable, at one end thereof, and having characteristics of causing a partial discharge at a defect resulting in the production of a pair of pulses propagating from the location of the defect in the cable in both directions;

terminating the other end of the cable so that a pulse be reflected at that other end;

receiving at said one end signals from the cable said signals including the pulses propagating from the location of said defect;

providing the auto-correlation function of the signals as received with another signal, the other signal being the same signal as received delayed in time; and providing a representation of said corelation function for variable settings as to delay between the signals and the other signals to provide an indication of the location of the insulation defect.

2. Method as in claim 1, wherein the terminating is comprised of no termination at all.

3. Method as in claim 1 and including the step of providing calibration by correlating an external stimulus applied to the one cable end with the reflection of that stimulus at the other cable end.

4. Method for detecting the location of an insulation defect in a cable prone to exhibit a partial discharge at that location, and wherein the cable is of the type exhibiting propagation of voltage pulses along its extension upon occurrence of such a discharge comprising the steps of:

transmitting voltage pulses into the cable on a period basis and of sufficient amplitude to produce partial electrostatic discharge at a defect;

detecting voltage signals at a given point in said cable including voltage pulses transmitted from the location of said defect to said given point, and voltage pulses also transmitted by said location and reflected at a cable end;

determining consistent auto-correlation between the signals as received and the same signals after a delay;

varying the delay for detecting a non-zero condition in the auto-correlation on the basis of periodic accumulation of non random correlation between the several pulses as received due to said discharge; and providing an indication of the condition that led to said non-zero condition in representation of the location of a defect.

* * * * *